US011463076B1

(12) United States Patent
Wu

(10) Patent No.: US 11,463,076 B1
(45) Date of Patent: Oct. 4, 2022

(54) RESISTANCE-ADJUSTABLE MEANS USING AT A PULL-UP OR PULL-DOWN DRIVER OF AN OCD CIRCUIT

(71) Applicant: Nanya Technology Corporation, New Taipei (TW)

(72) Inventor: Chang-Ting Wu, Hsinchu County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/361,541

(22) Filed: Jun. 29, 2021

(51) Int. Cl.
*H03B 1/00* (2006.01)
*H03K 3/00* (2006.01)
*H03K 5/1252* (2006.01)
*H03K 17/56* (2006.01)
*G11C 11/4096* (2006.01)

(52) U.S. Cl.
CPC ........... *H03K 5/1252* (2013.01); *H03K 17/56* (2013.01); *G11C 11/4096* (2013.01)

(58) Field of Classification Search
CPC ....... H03K 19/00315; H03K 19/00361; H03K 19/0013; H03K 19/018521; H03K 17/164
USPC ............................................ 327/112; 326/30
See application file for complete search history.

(56) References Cited

U.S. PATENT DOCUMENTS

| | | | | |
|---|---|---|---|---|
| 7,068,078 B2* | 6/2006 | Yoo | ...................... | G11C 7/1057 326/87 |
| 7,495,469 B2* | 2/2009 | Park | ................... | H03K 19/0005 326/27 |
| 7,532,056 B2* | 5/2009 | Seo | ......................... | G01K 7/01 327/512 |
| 8,278,968 B2* | 10/2012 | Nguyen | ................... | H03K 5/24 326/30 |
| 9,344,088 B1* | 5/2016 | Sanchez | ......... | H03K 19/018521 |
| 9,692,394 B1* | 6/2017 | Agrawal | ............ | H03K 19/0005 |
| 10,693,460 B1* | 6/2020 | Takahashi | ........... | G11C 11/4093 |
| 2005/0040845 A1* | 2/2005 | Park | ................... | H03K 19/0005 326/30 |
| 2008/0048714 A1* | 2/2008 | Lee | .................... | H03K 19/0005 326/30 |
| 2010/0110801 A1* | 5/2010 | Song | ...................... | G11C 5/143 365/189.05 |
| 2011/0260756 A1* | 10/2011 | Agut | .................. | H03K 19/0013 327/81 |
| 2015/0171863 A1 | 6/2015 | Ha | | |
| 2016/0134285 A1 | 5/2016 | Ha | | |
| 2016/0269029 A1* | 9/2016 | Chou | ............. | H03K 19/018557 |
| 2017/0154668 A1 | 6/2017 | Ha | | |

* cited by examiner

*Primary Examiner* — Quan Tra
(74) *Attorney, Agent, or Firm* — Birch, Stewart, Kolasch & Birch, LLP

(57) ABSTRACT

This invention provides a resistance-adjustable means using at a pull-up driver and/or a pull-down driver of an OCD circuit. When the resistance-adjustable means is applicable to the pull-up driver, the resistance-adjustable means includes a triode-mode PMOS coupled to a circuit of the pull-up driver and at least one of one or more adjustable resistors and/or a fixed resistor, which are connected in series and coupled to the triode-mode PMOS, and the at least one of the adjustable resistors or the fixed resistor is coupled to an IO (input/output) pad. When the resistance-adjustable means is applicable to the pull-down driver, a triode-mode NMOS is used to replace the triode-mode PMOS for the resistance-adjustable means.

17 Claims, 19 Drawing Sheets

US 11,463,076 B1

RESISTANCE-ADJUSTABLE MEANS USING AT A PULL-UP OR PULL-DOWN DRIVER OF AN OCD CIRCUIT

BACKGROUND OF THE INVENTION

Field of the Invention

The present invention relates to a circuit design of an adjustable resistor means applicable in an OCD (Off-Chip Driver) driver of a memory device and a method using the adjustable resistor means to improve signal integrity on transmission channels.

Description of the Prior Art

In memory devices widely applied to high-performance electronic systems, as the advance of DDR4 to DDR5 generations, the operating speed of the memory is also increasing. During high-speed transmission, the capacitance loading for the IO pad (input/output) of DRAM will easily cause signal degradation or even distortion on the transmission. This phenomenon will become more serious as the operating frequency increases.

In addition, different DQ channels have different distributions in the chip, and the offset differences caused by the manufacturing process will cause slightly different impedance mismatching issues among each DQ channel. It directly affects the signal quality of the receiving end.

See FIG. 1 and FIG. 2 for an illustration of a common structure using in an OCD driver of a memory, wherein the OCD driver 1000 is constituted by a pull-up driver 1100 and a pull-down driver 1200. As shown in FIG. 2, the pull-up driver 1100 and the pull-down driver 1200 individually includes a plurality of MOSs that the MOSs are finally coupled to one or more fixed resistors, and those fixed resistors are coupled to an IO pad 1300.

For the structure of the OCD driver, the VDD or VSS passes through the passive impedance loading R via the plurality of MOSs to reach the IO pad. But this structure will cause that the IO pad 1300 needs to bear a huge loading effect causing from all the MOSs and all the passive impedance components such as the fixed resistors, so that causes the signal transmission distortion which is more serious during the high-speed operation.

In order to solve the above problems, a different circuit structure and method is required in the OCD driver to reduce the load effect on the IO pad, diminish the signal loss and distortion during high-speed transmission, and reduce impedance mismatch from each DQ channel as well.

SUMMARY OF THE INVENTION

The present disclosure provides a resistance-adjustable means using at a pull-up driver and/or a pull-down driver of an OCD circuit, and an adjustable OCD driver, which reduce the load effect on the IO pad.

According to an aspect of the present invention, a resistance-adjustable means using at a pull-up driver is provided. The resistance-adjustable means at a pull-up driver comprises a triode-mode PMOS coupled to a circuit of the pull-up driver and at least one of one or more adjustable resistors and/or a fixed resistor, which are connected in series and coupled to the triode-mode PMOS. The at least one of the adjustable resistors or the fixed resistor is coupled to an IO (input/output) pad.

According to an aspect of the present invention, a resistance-adjustable means using at a pull-down driver is provided. The resistance-adjustable means at a pull-down driver comprises a triode-mode NMOS coupled to a circuit of the pull-down driver and at least one of one or more adjustable resistors and/or a fixed resistor, which are connected in series and coupled to the triode-mode NMOS. The at least one of the adjustable resistors or the fixed resistor is coupled to an IO pad.

In an example embodiment of the resistance-adjustable means, the fixed resistor may be coupled to the IO pad when the resistance-adjustable means comprises both of the adjustable resistors and the fixed resistor.

In an example embodiment of the resistance-adjustable means, the one or more adjustable resistors may be controlled to produce an effective resistance according to a resistance value required for the IO pad so as to meet a desired impedance of a signal channel coupled to the IO pad.

In an example embodiment of the resistance-adjustable means, each of the adjustable resistors may include, a switch for controlling whether the adjustable resistor is short circuit or not.

In an example embodiment of the resistance-adjustable means, the switch of the resistance-adjustable means using at a pull-up driver may comprise a PMOS and/or a multiplexer; and the switch of the resistance-adjustable means using at a pull-down driver may comprise a NMOS and/or a multiplexer.

In an example embodiment of the resistance-adjustable means, the circuit of the pull-up driver may comprise one of one or more PMOSs coupled in series, or a plurality of PMOSs coupled in series which are paralleled with each other; the circuit of the pull-down driver may comprise one of one or more NMOSs coupled in series, or a plurality of NMOSs coupled in series which are paralleled with each other.

According to an aspect of the present invention, an adjustable OCD driver is provided. The adjustable OCD driver comprises a pull-up driver controlled by a pull-up control code configured to provide a first pull-up circuit including a first PMOS coupled to a first resistance-adjustable means and a second pull-up circuit configured to be paralleled with the first pull-up circuit, and the second pull-up circuit is coupled to a second resistance-adjustable means; and a pull-down driver controlled by a pull-down control code configured to provide a first pull-down circuit including a first NMOS coupled to a third resistance-adjustable means and a second pull-down circuit configured to be paralleled with the first pull-down circuit, wherein the second pull-down circuit is coupled to a fourth resistance-adjustable means; wherein the first resistance-adjustable means is configured to provide a first triode-mode PMOS coupled between the first PMOS and at least one of one or more first adjustable resistors and/or a first fixed resistor, wherein the at least one of the first adjustable resistors or the first fixed resistor is coupled to an IO (input/output) pad; wherein the third resistance-adjustable means is configured to provide a first triode-mode NMOS coupled between the first NMOS and at least one of one or more second adjustable resistors and/or a second fixed resistor, wherein the at least one of the second adjustable resistors or the second fixed resistor is coupled to the IO pad; wherein both the second resistance-adjustable means and the fourth resistance-adjustable means are coupled to the IO pad.

In an example embodiment of the adjustable OCD driver, the second resistance-adjustable means may be configured to provide a second triode-mode PMOS coupled between the second pull-up circuit and at least one of one or more third adjustable resistors and/or a third fixed resistor.

In an example embodiment of the adjustable OCD driver, the fourth resistance-adjustable means may be configured to provide a second triode-mode NMOS coupled between the second pull-down circuit and at least one of one or more fourth adjustable resistors and/or a fourth fixed resistor.

In an example embodiment of the adjustable OCD driver, the second pull-up circuit comprises one of one or more second PMOSs coupled in series, or a plurality of second PMOSs coupled in series which are paralleled with each other.

In an example embodiment of the adjustable OCD driver, the second pull-down circuit comprises one of one or more second NMOSs coupled in series, or a plurality of second NMOSs coupled in series which are paralleled with each other.

The previously described aspects rendered in the following detailed explanations of the non-limiting, substantive embodiments in accordance with the present invention with the accompanying drawings will provide a better understanding of the present invention.

BRIEF DESCRIPTION OF THE DRAWINGS

The foregoing and other features and advantages of the example embodiments of the present invention will become more apparent upon consideration of certain example embodiments of the inventive concepts illustrated in the accompanying drawings. The drawings are not necessarily to scale, but emphasize certain features and principles of the example embodiments of the inventive concepts. Throughout the drawings and written description, like reference numbers and labels are used to denote like or similar elements and features. In the drawings:

FIGS. 3A and 3B are circuit diagrams of a resistance-adjustable means using at a pull-up driver according to the present invention, in which FIG. 3B is a practicable example of FIG. 3A.

FIGS. 4A and 4B are circuit diagrams of a resistance-adjustable means using at a pull-down driver according to the present invention, in which FIG. 4B is a practicable example of FIG. 3A.

DETAILED DESCRIPTION OF THE PREFERRED EMBODIMENTS

Figure 1:
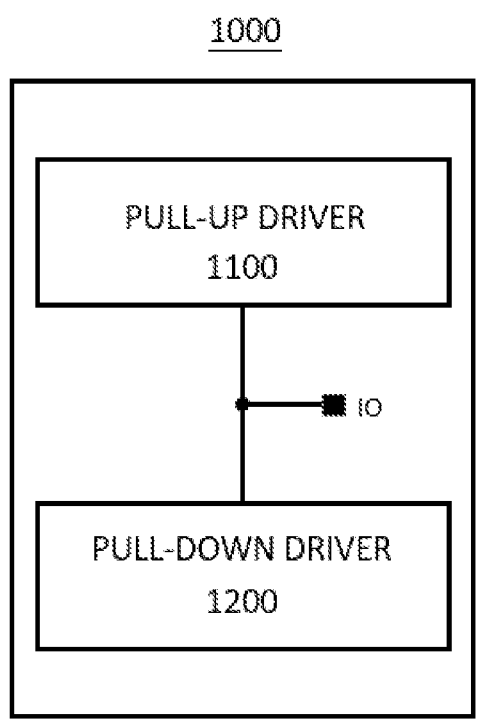
FIG. 1 is a block diagram of an OCD driver including a pull-up driver and a pull-down driver of the prior art.

As used herein, the term "and/or includes any and all combinations of one or more of the associated listed items. Hereinafter, exemplary embodiments of the present inventive concept will be described in detail with reference to the accompanying drawings. The exemplary embodiments of the present inventive concept are provided so that this disclosure will be thorough and complete, and will fully convey the present inventive concept to one of ordinary skill in the art. Since the inventive concept may have diverse modified embodiments, exemplary embodiments are illustrated in the drawings and are described in the detailed description of the inventive concept. However, this does not limit the present inventive concept within specific embodiments and it should be understood that the present inventive concept covers all the modifications, equivalents, and replacements within the idea and technical scope of the present inventive concept. Like reference numerals may refer to like elements throughout. In the drawings, the dimensions and size of each structure may be exaggerated, reduced, or schematically illustrated for convenience in description and clarity.

Terms like "first", "second" . . . etc. It may be used to describe various elements, but the elements should not be limited by the terms. The terms may be used only as purpose for distinguishing an element from another element.

It will be understood that, although the terms first, second, third, etc. may be used herein to describe various elements, components, regions and/or sections, these elements, components, regions and/or sections should not be limited by these terms. These terms are only used to distinguish one element, component, region or section from another element, component, region or section. Thus, a first element, component, region or section discussed below could be termed a second element, component, region or section without departing from the teachings of the example embodiments of the inventive concepts.

Figure 3A:
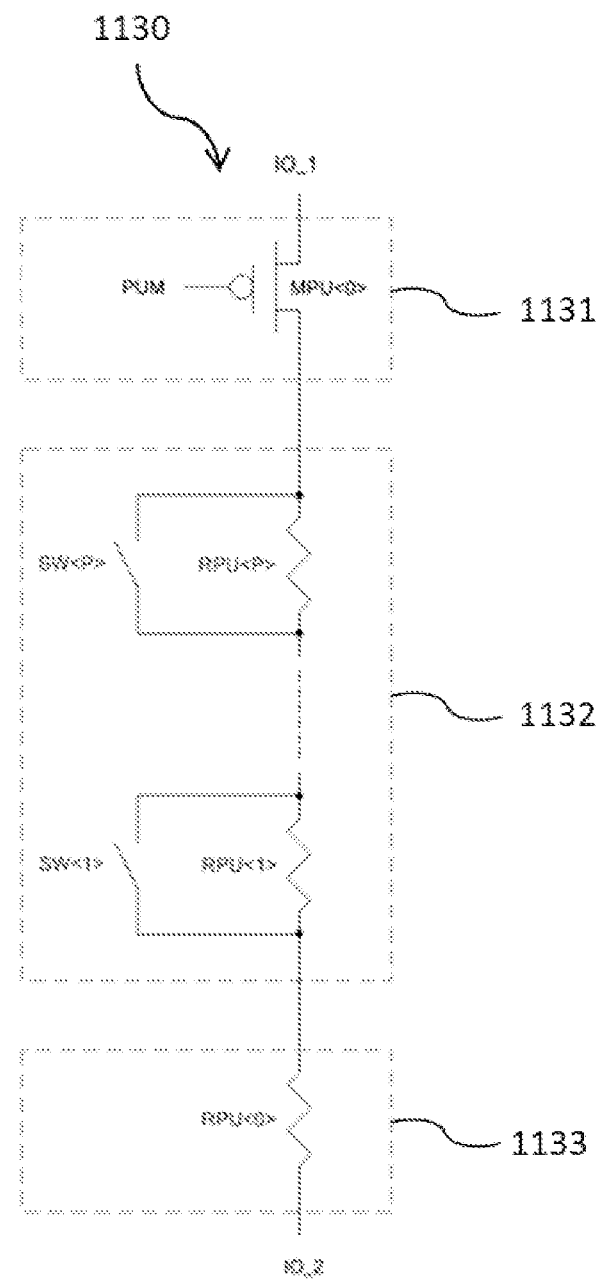
Figure 3B:
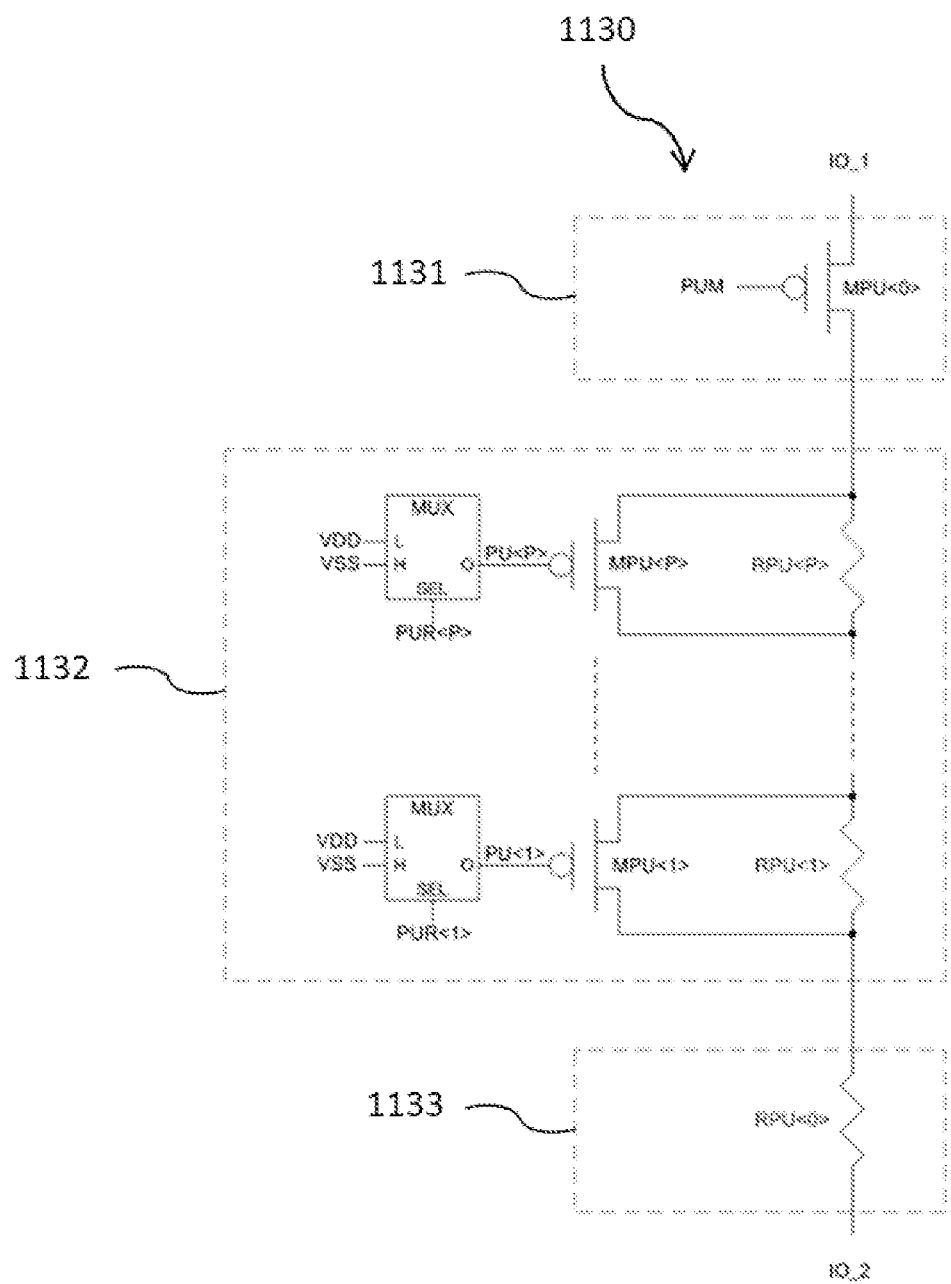

FIGS. 3A and 3B are circuit diagrams of a resistance-adjustable means using at a pull-up driver according to the present invention, in which FIG. 3B may be a practicable example of FIG. 3A.

Figure 3C:
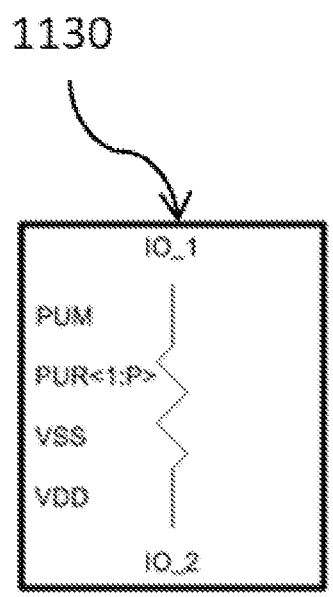
FIG. 3C is a simplified diagram of FIG. 3A with various symbols representing different circuit parts in FIG. 3A.

Referring to FIGS. 3A to 3C, the present invention provides a sort of light capacitance adjustable resistance means 1130 using at the pull-up driver 1100 (hereafter referred to as the "LCAPUR" 1130) comprising a triode-mode PMOS 1131 serially coupled with an adjustable resistor circuit 1132 which is connected to a fixed resistor 1133 in series. The adjustable resistor circuit 1132 includes adjustable resistor RPU<1> to adjustable resistor RPU<P> connected in series, wherein P may be equal to 1 or other integer as desired in circuit design. In this example embodiment, the fixed resistor 1133 is connected to an IO (input/output) pad 1300. FIG. 3C is a simplified diagram with various symbols representing different circuit parts of the LCAPUR 1130. The simplified diagram of FIG. 3C is used in other drawings representing the LCAPUR 1130 included to avoid the drawings overly complicated.

Please note the LCAPUR 1130 may be realized by any of following examples: (i) a triode-mode PMOS 1131 coupled with an adjustable resistor circuit 1132 in series; (ii) a triode-mode PMOS 1131 coupled with a fixed resistor 1133 in series; and (iii) a triode-mode PMOS 1131 coupled with an adjustable resistor circuit 1132 and a fixed resistor 1133 in series.

The functions and details of the triode-mode PMOS 1131, the adjustable resistor circuit 1132, and the fixed resistor 1133, of the LCAPUR 1130 are described below:

When the LCAPUR 1130 is coupled to the circuit of the pull-up driver 1100 (such as coupled to the circuit denoted as 1110 or 1120 in FIG. 2), the triode-mode PMOS 1131 is an active component MOS operating in the triode zone, and it functions as a voltage-controlled resistor to replace a partial portion of the physical resistor (for example RP1 or RP2 in FIG. 2) of the OCD driver. Comparing with the prior art, the triode-mode PMOS 1131 could be controllable to provide a value of the resistance when the triode-mode PMOS 1131 is at ON status, or be controllable to provide a less capacitance when the triode-mode PMOS 1131 is at OFF status, and the ON/OFF status of the triode-mode PMOS 1131 is controlled by a code PUM.

For the adjustable resistor circuit 1132, referring to FIG. 3A, the adjustable resistor circuit 1132 is an application of a plurality of resistor units connected in series and each of the resistor units including a switch (SW<1>, ..., SW<P>) which is paralleled with a resistor (RPU<1>, ..., RPU<P>) for controlling whether the resistor is short circuit or not. For example, the switch SW<1> is at ON status, the resistor RPU<1> is short-circuit, and the resistor RPU<1> contributes approximately zero impedance. While when the switch SW<1> is at OFF status, the resistor RPU<1> contributes the impedance itself. In this example embodiment, the adjustable resistor circuit 1132 are controllable to produce an effective resistance according to a resistance value required for the IO pad 1300 to meet a desired impedance of a signal channel coupled to the IO pad 1300 for reducing impedance mismatch among signal channels. In addition, please referring to FIG. 3B, FIG. 3B illustrates a practicable example of the adjustable resistor circuit 1132 in which each resistor unit may only use a PMOS as the switch, or a PMOS connected with a multiplexer as the switch. See FIGS. 5A and 5B, the adjustable resistor circuit 1132 may be controlled by a pull-up control code PUR<1:P>, which can control the impedance of each pull-up resistor RPU<1>, ..., RPU<P> effective or not, for example, the designer can set PUR<1:P>=L, that is, the gate of PMOS equal to the VDD or H, which presented the impedance of the resistor correspondingly. Conversely, the designer can set PUR<1:P>=H, that is, the gate of PMOS equal to the VSS or L, which presented a short-circuit or zero impedance.

Figure 2:
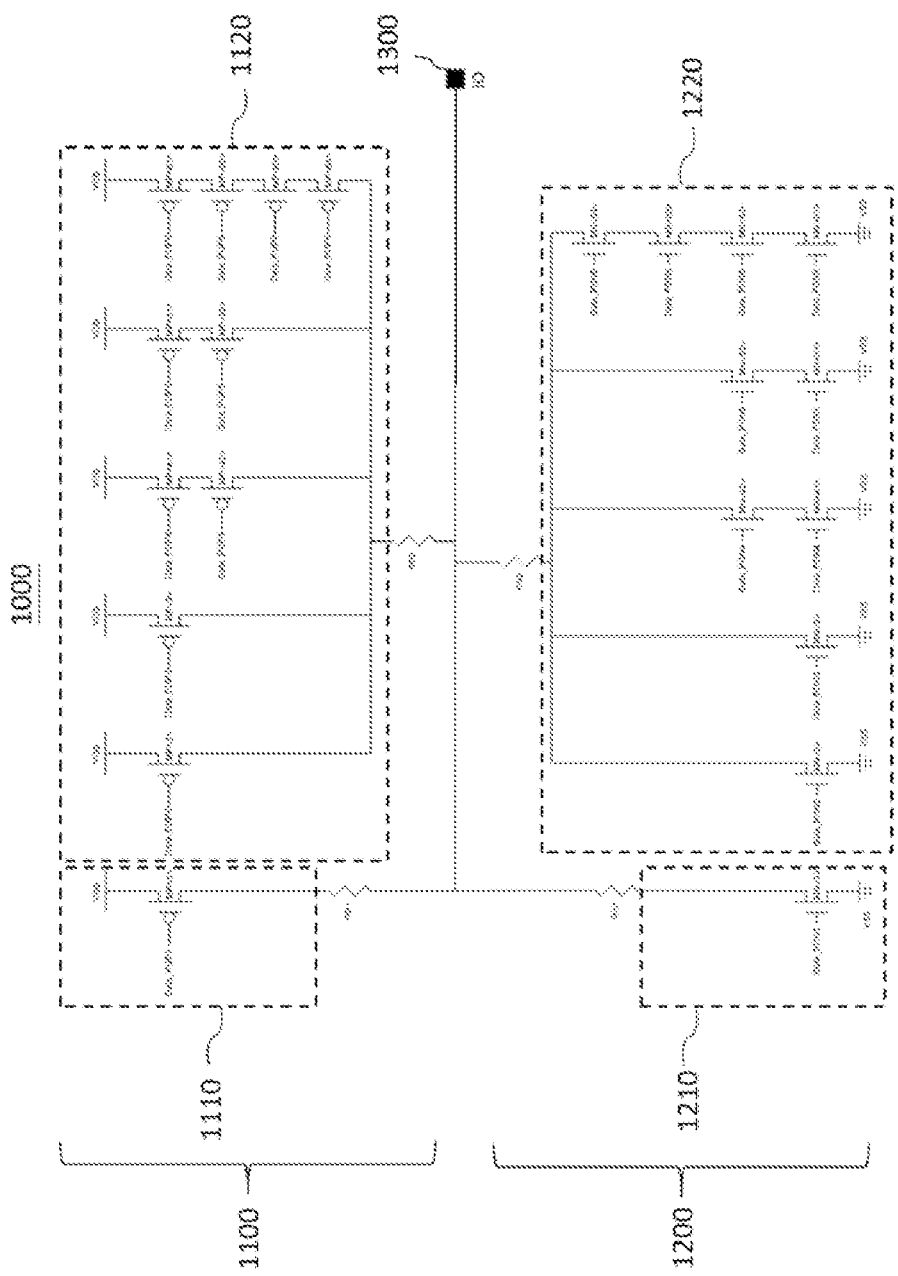
FIG. 2 is a circuit diagram of the conventional structure of the OCD driver of the prior art.

For the fixed resistor 1133, the fixed resistor 1133 works as a physical resistor with an impendence less than the RP1 and RP2 of the conventional OCD driver shown in FIG. 2, and the fixed resistor 1133 is preferably close to the IO pad 1300, playing a role for achieving the ESD (Electrostatic Discharge) protection effect in circuits. As shown in FIG. 3B, it is preferable that the fixed resistor 1133 is connected to the IO pad 1300 when the LCAPUR 1130 comprises both of the adjustable resistor circuit 1132 and the fixed resistor 1133. The LCAPUR 1130 may not include the fixed resistor 1133 when the adjustable resistor circuit 1132 can provide the ESD protection effect in circuits.

Figure 4A:
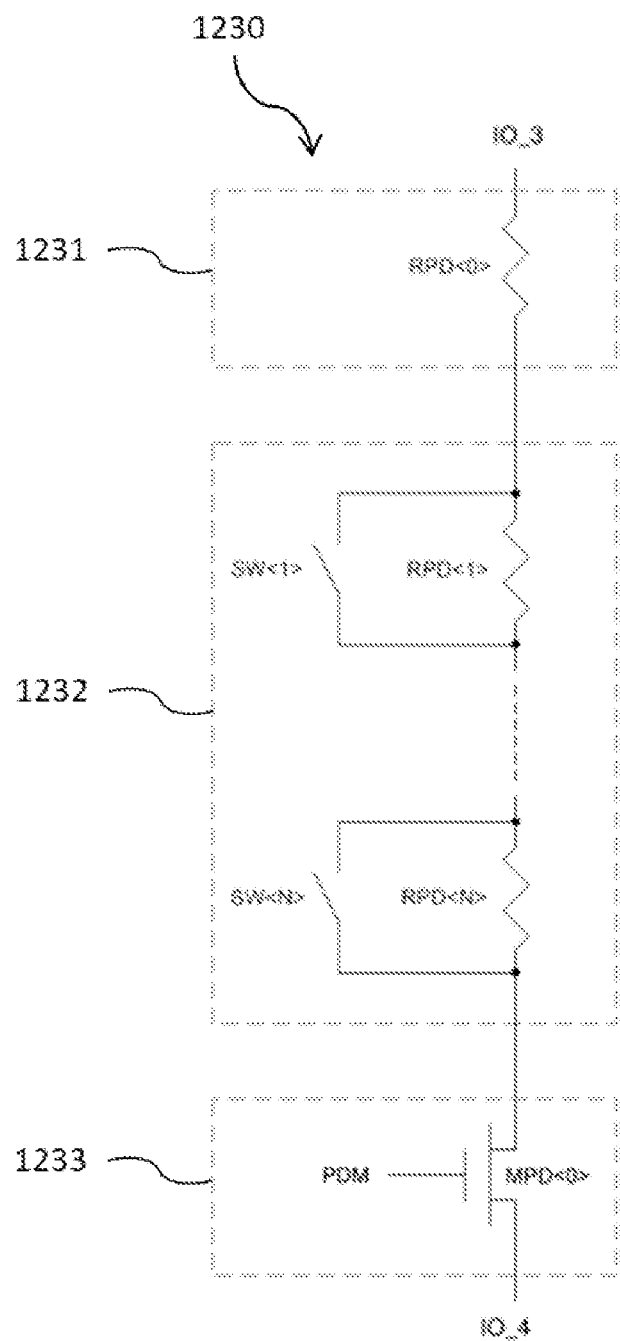
Figure 4B:
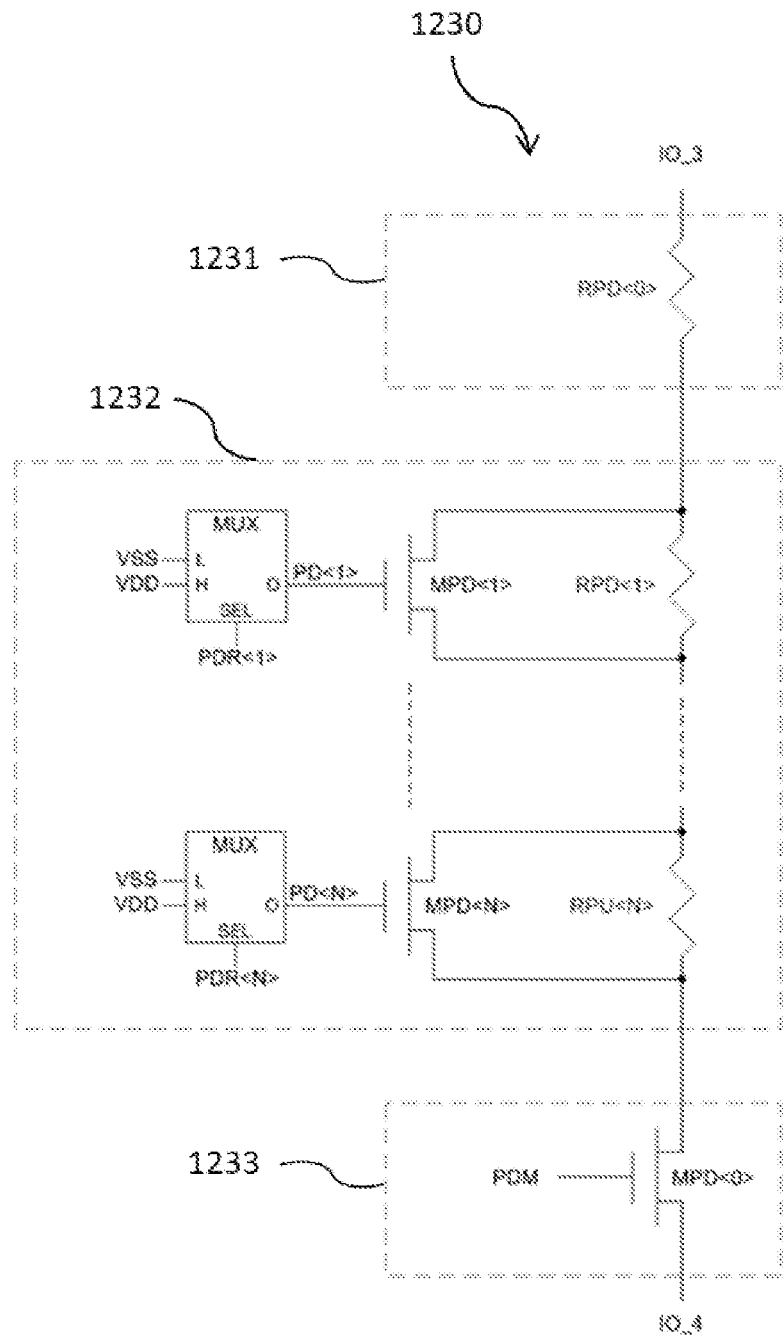

FIGS. 4A and 4B are circuit diagrams of a resistance-adjustable means using at a pull-down driver according to the present invention, in which FIG. 4B is a practicable example of FIG. 4A.

Figure 4C:
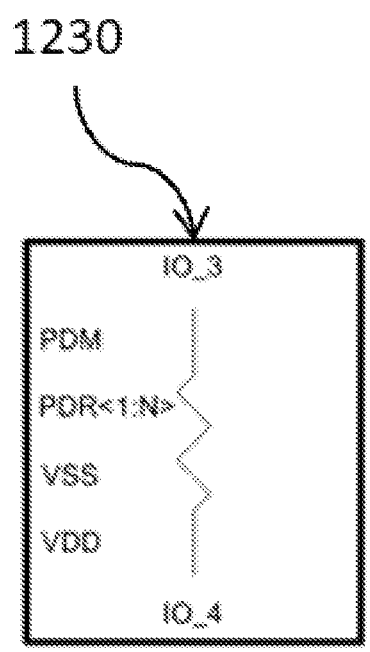
FIG. 4C is a simplified diagram of FIG. 4A with various symbols representing different circuit parts in FIG. 4A.

Referring to FIGS. 4A to 4C, the present invention provides a sort of light capacitance adjustable resistor circuit 1230 using at the pull-down driver 1200 (hereafter referred to as the "LCAPDR" 1230) comprising: a triode-mode NMOS 1233 serially coupled with an adjustable resistor circuit 1232 which is connected to a fixed resistor 1231 in series. The fixed resistor 1231 is connected to an IO pad 1300. FIG. 4C is a simplified diagram with various symbols representing different circuit parts of the LCAPDR 1230. The simplified diagram of FIG. 4C is used in other drawings representing the LCAPDR 1230 included to avoid the drawings overly complicated.

Please note the LCAPDR 1230 may be realized by any of following examples: (i) a triode-mode NMOS 1233 coupled with an adjustable resistor circuit 1232 in series; (ii) a triode-mode NMOS 1233 coupled with a fixed resistor 1231 in series; and (iii) a triode-mode NMOS 1233 coupled with an adjustable resistors circuit 1232 and a fixed resistor 1231 in series.

The functions and details of the triode-mode NMOS 1233, the adjustable resistor circuit 1232, and the fixed resistor 1231, of the LCAPDR 1230 are described below:

When the LCAPDR 1230 is coupled to the circuits of the pull-down driver 1200 (such as coupled to the circuits denote as 1210 or 1220 in FIG. 2), the triode-mode NMOS 1233 is an active component MOS operating in the triode zone, and it functions as a voltage-controlled resistor to replace a partial portion of the physical resistor (for example RN1 or RN2 in FIG. 2) of the OCD driver. Comparing with the prior art, the triode-mode NMOS 1233 could be controllable to provide a value of the resistance when the triode-mode NMOS 1233 is at ON status, or be controllable to provide a less capacitance when the triode-mode NMOS 1233 is at OFF status because the pull-up driver 1100 and the pull-down driver 1200 are synchronized as logic control signal, and the ON/OFF status of the triode-mode NMOS 1233 are controlled by a code PDM.

For the adjustable resistor circuit 1232, referring to FIG. 4A, the adjustable resistor circuit 1232 is an application of a plurality of resistor units connected in series and each of the resistor units including a switch (SW<1>, ..., SW<N>) which is paralleled with a resistor (RPD<1>, ..., RPD<N>) for controlling whether the resistor is short circuit or not. For example, the switch SW<1> is at ON status, the resistor RPD<1> contributes approximately zero impedance. While when the switch SW<1> is at OFF status, the resistor RPD<1> contributes the impedance itself. In this example embodiment, the adjustable resistor circuit 1232 is controllable to produce an effective resistance according to a resistance value required for the IO pad 1300 to meet a desired impedance of a signal channel coupled to the IO pad 1300 for reducing impedance mismatch among signal channels. In addition, please referring to FIG. 4B, FIG. 4B illustrates a practicable example of the adjustable resistor circuit 1232, in which each resistor unit may only use an NMOS as the switch, or a NMOS connected with a multiplexer as the switch. See FIGS. 6A and 6B, in the present invention, the adjustable resistor circuit 1232 may be controlled by a pull-down control code PDR<1:N>, which can control the impedance of each pull-down resistor RPD<1>, ..., RPD<N> effective or not, for example, the designer can set PDR<1:N>=H presented a short-circuit or zero impedance, and PDR<1:N>=L presented the impedance of the resistor correspondingly.

For the fixed resistor 1231, the fixed resistor 1231 works as a physical resistor with an impendence less than the RN1 and RN2 of the conventional OCD driver shown in FIG. 2, and the fixed resistor 1231 is preferably close to the IO pad 1300, playing a role for achieving the ESD (Electrostatic Discharge) protection effect in circuits. It is preferable that the fixed resistor 1231 is connected to the IO pad 1300 when the LCAPDR 1230 comprises both of the adjustable resistor circuit 1232 and the fixed resistor 1231. The LCAPDR 1230 may not include the fixed resistor 1231 when the adjustable resistor circuit 1232 can achieve the ESD protection effect in circuits.

Based on the inventive concept of the present invention, the advantage of the technical means as described above is that the IO pad 1300 only meet the active component MOS operating in the triode zone (such as the triode-mode PMOS 1131 or the triode-mode NMOS 1233), so that the IO pad 1300 only bears the capacitance effect (such as Cgd and Cdb) from the triode-mode PMOS 1131 or the triode-mode NMOS 1233, and no longer has to bear the capacitance effect from the active components PMOSs of the circuits 1110 and 1120 of the pull-up driver 1100 or the active components NMOSs of the circuits 1210 and 1220 of the pull-down driver 1200.

Thus, for the IO pad, the capacitance effect in the present invention will be less than the sum of the capacitance effect of the conventional OCD circuit as shown in FIG. 2.

Figure 5A:
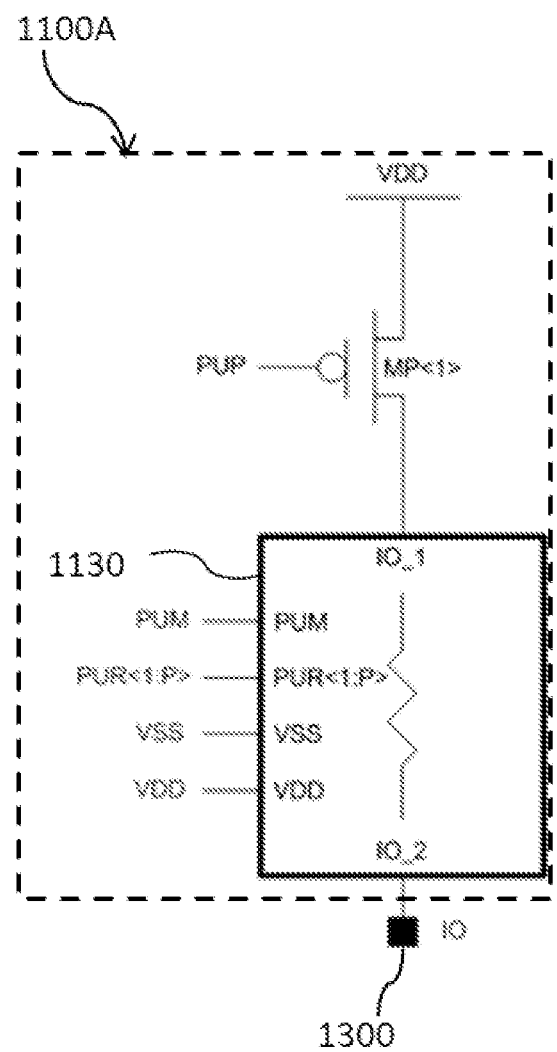
FIGS. 5A-5C are circuit diagrams of the resistance-adjustable means using at a pull-up driver coupled to various examples according to the present invention.
Figure 5B:
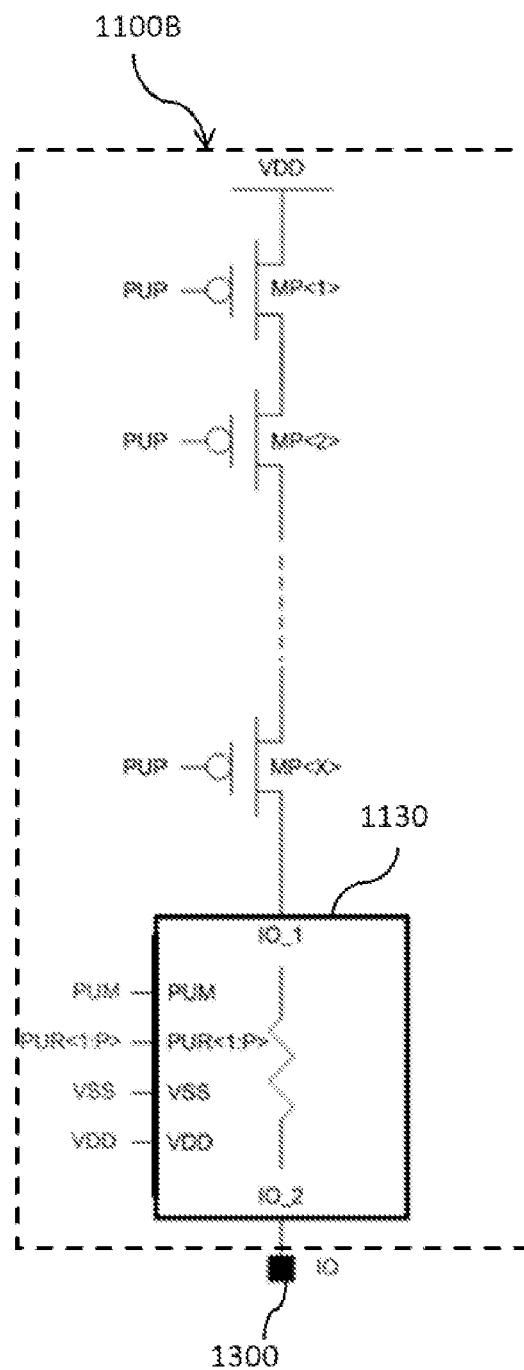
Figure 5C:
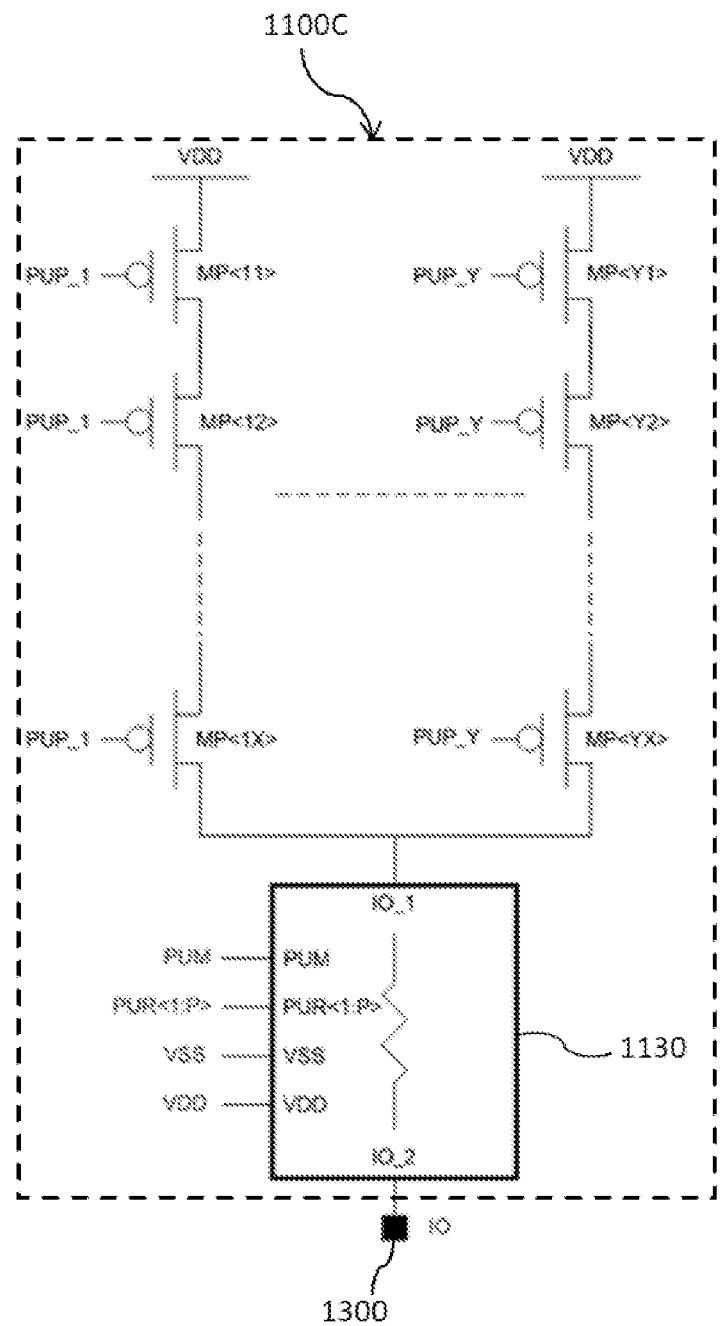

FIGS. 5A-5C are circuit diagrams of the resistance-adjustable means using at a pull-up driver coupled to various examples according to the present invention.

Referring to FIGS. 5A-5C. FIG. 5A illustrates a circuit diagram 1100A of a LCAPUR 1130 connected to VDD via a PMOS. FIG. 5B illustrates a circuit diagram 1100B of a LCAPUR 1130 connected to VDD via a plurality of PMOSs coupled in series. FIG. 5C illustrates a circuit diagram 1100C of a LCAPUR 1130 connected to VDD via a plurality of PMOSs coupled in series which are paralleled with each other. According to the foregoing, an artisan in the art would learn that the LCAPUR 1130 is limited to connect the IO pad 1300, but is not limit to connect to VDD via different type of the circuits (1100A-1100C).

Figure 6A:
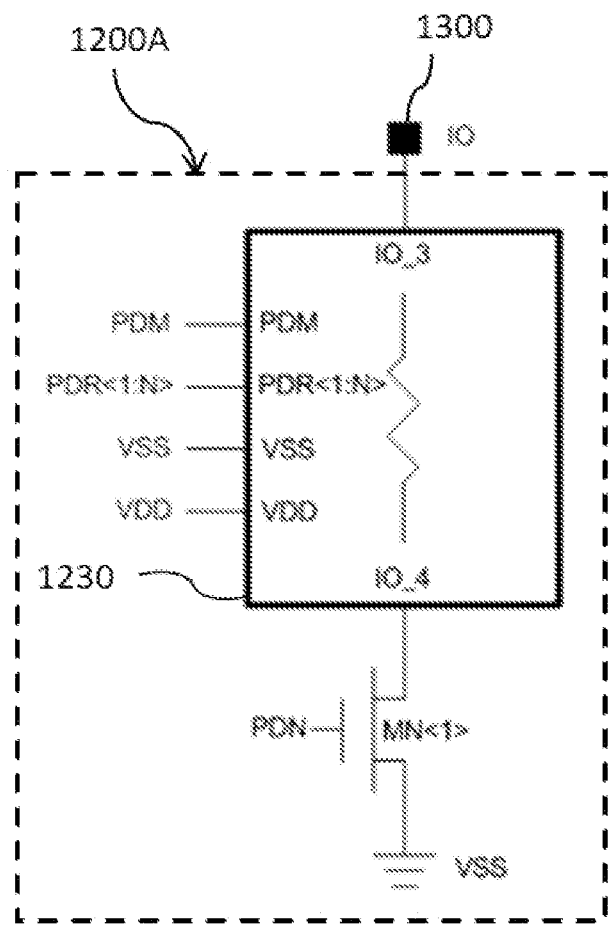
FIGS. 6A-6C are circuit diagrams of the resistance-adjustable means using at a pull-down driver coupled to various examples according to the present invention.
Figure 6B:
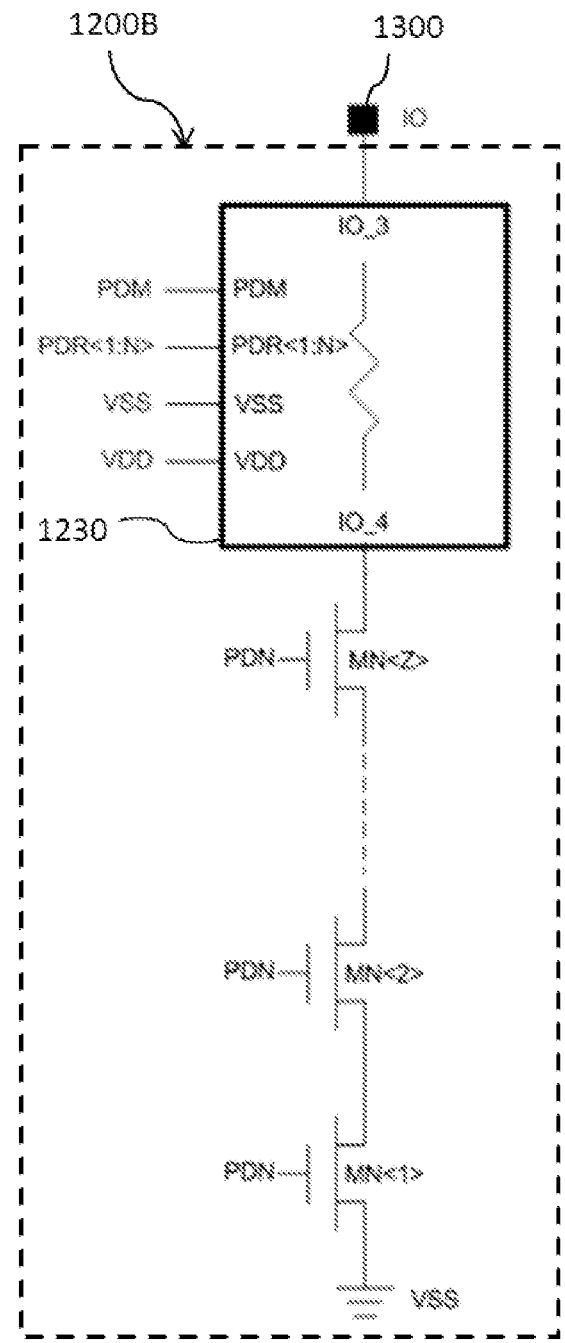
Figure 6C:
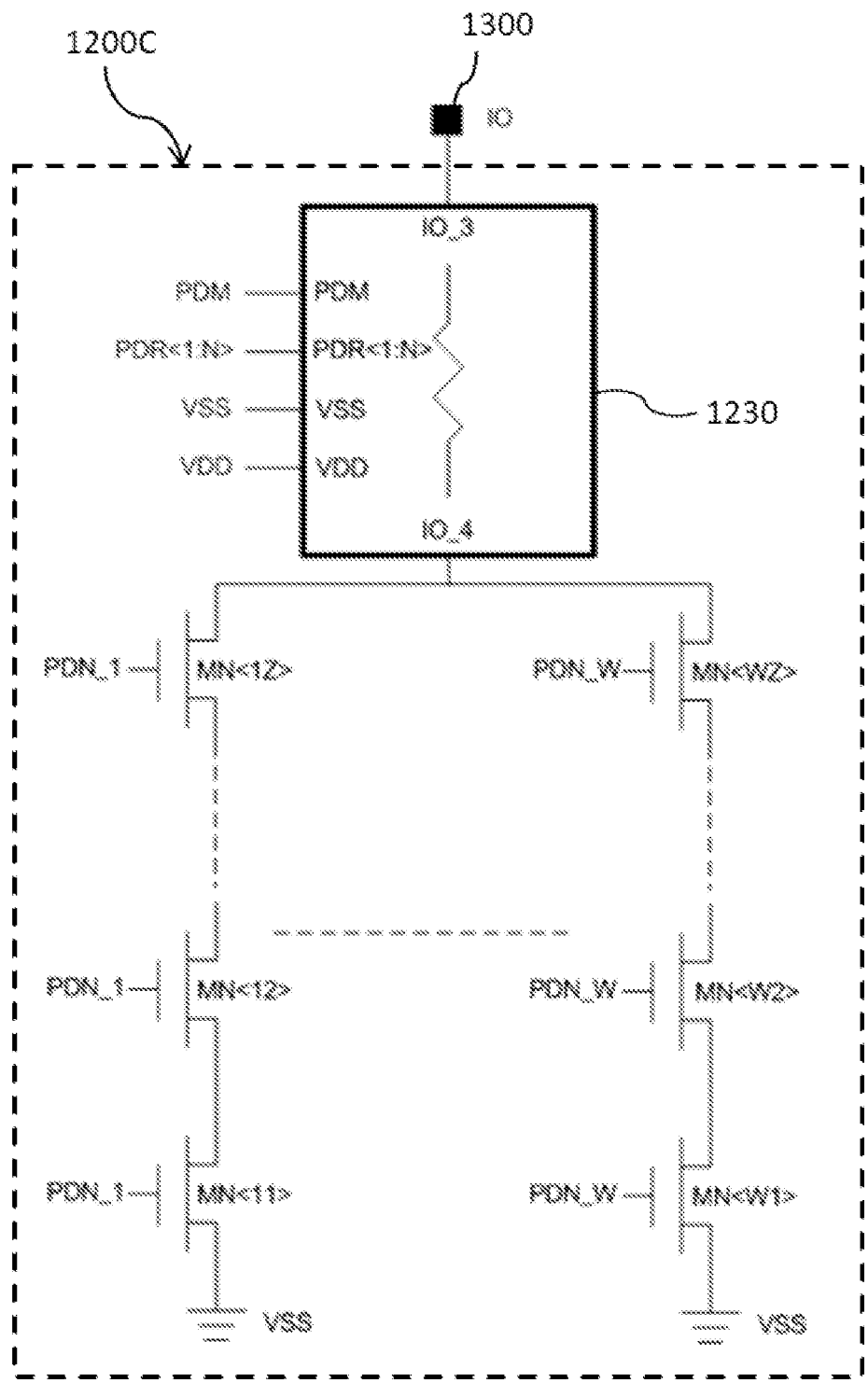

FIGS. 6A-6C are circuit diagrams of the resistance-adjustable means using at a pull-down driver coupled to various examples according to the present invention.

Referring to FIGS. 6A-6C. FIG. 6A illustrates a circuit diagram 1200A of a LCAPDR 1230 connected to VSS via a NMOS. FIG. 6B illustrates a circuit diagram 1200B of a LCAPDR 1230 connected to VSS via a plurality of NMOSs coupled in series. FIG. 5C illustrates a circuit diagram 1200C of a LCAPDR 1230 connected to VSS via a plurality of NMOSs coupled in series which are paralleled with each other. According to the foregoing, an artisan in the art would learn that the LCAPDR 1230 is limited to connect the IO pad 1300, but is not limit to connect to VSS via different type of the circuits (1200A-1200C).

For the circuit configurations of FIGS. 5A-5C and FIGS. 6A-6C, the LCAPUR 1130 and the LCAPDR 1230 can also be used in any type of integrated circuits as desired for reducing the capacitance effect.

Figure 7:
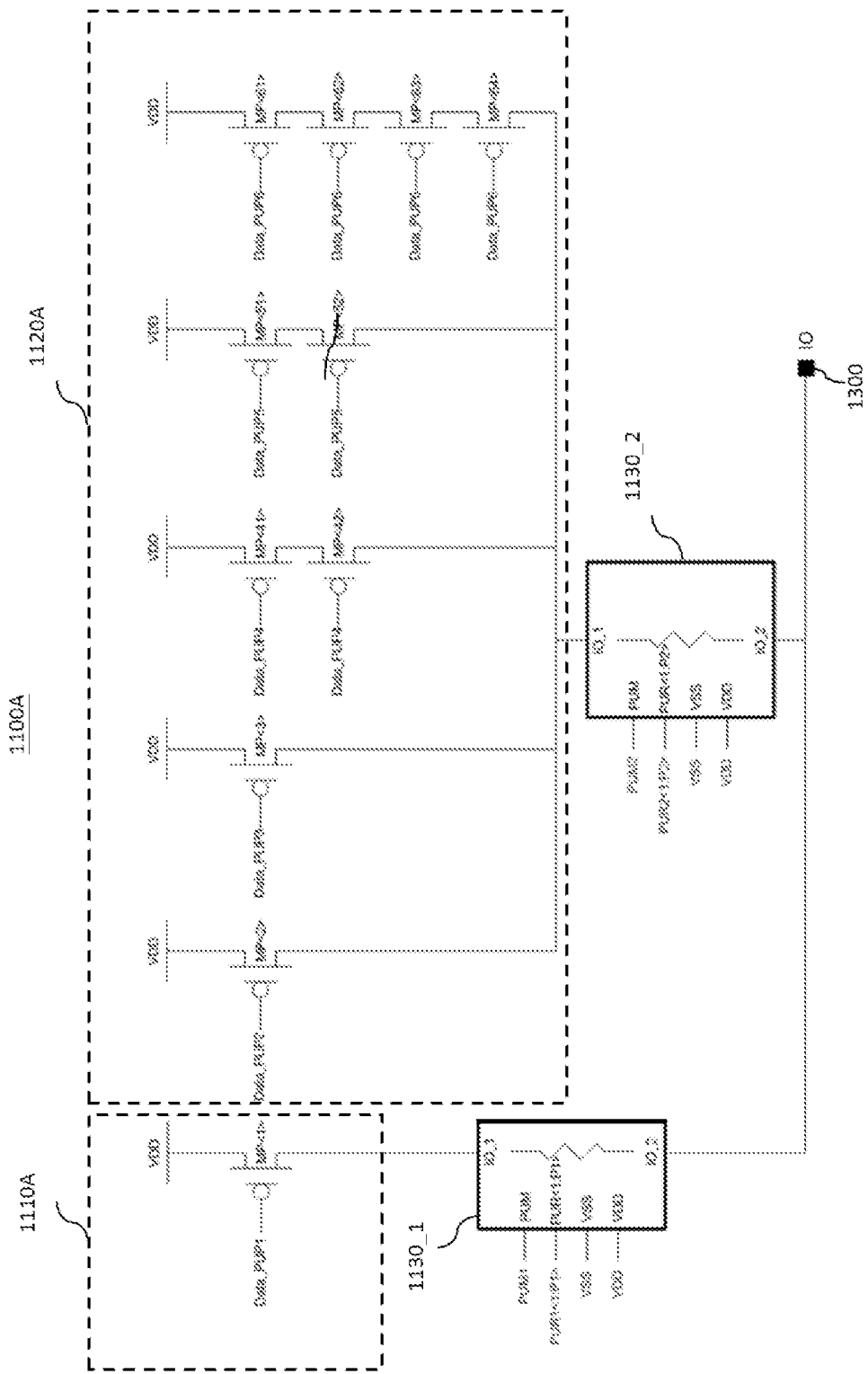
FIG. 7 is a circuit diagram of the pull-up driver with the resistance-adjustable means according to the present invention.
Figure 8:
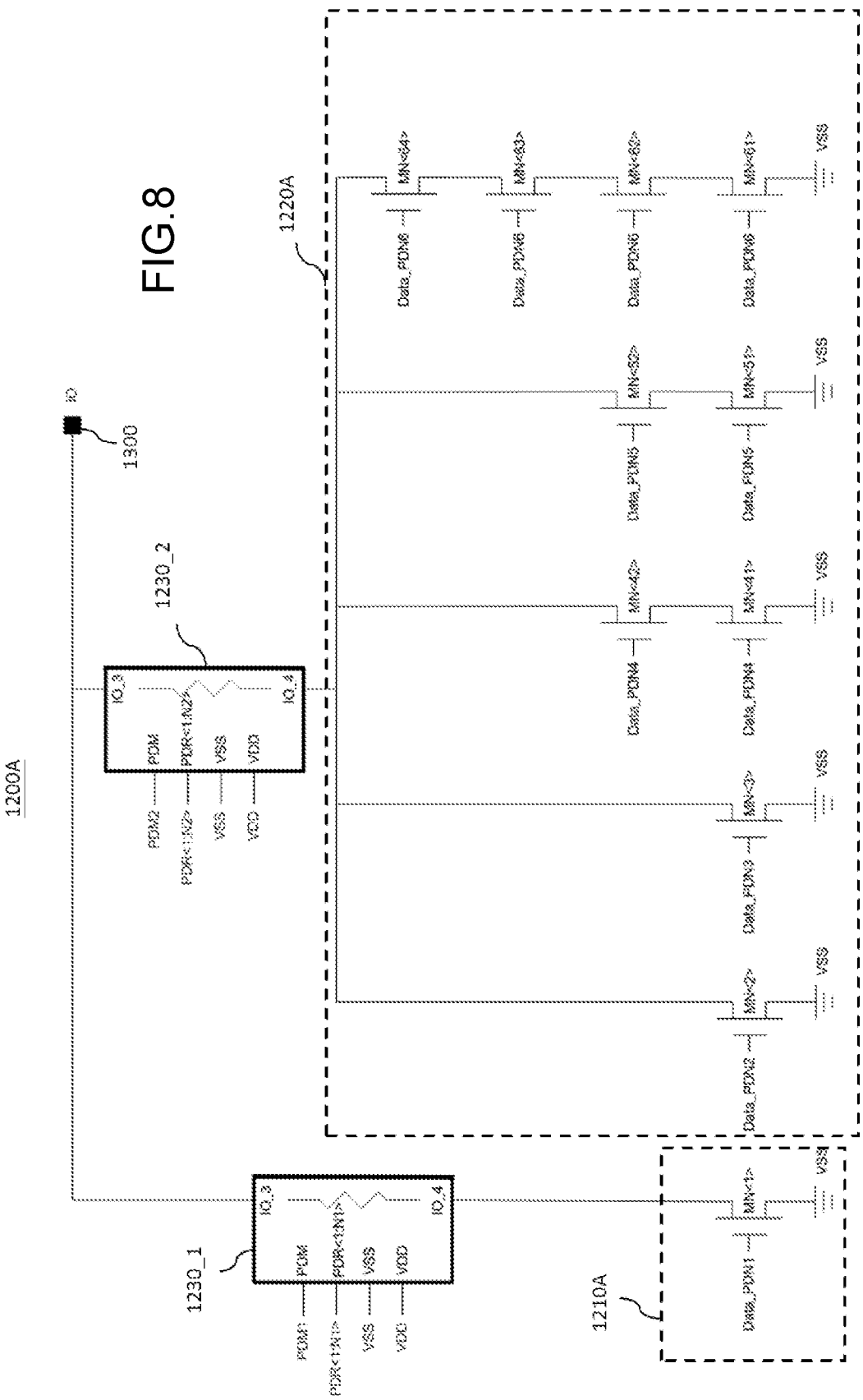
FIG. 8 is a circuit diagram of the pull-down driver with the resistance-adjustable means according to the present invention.
Figure 9:
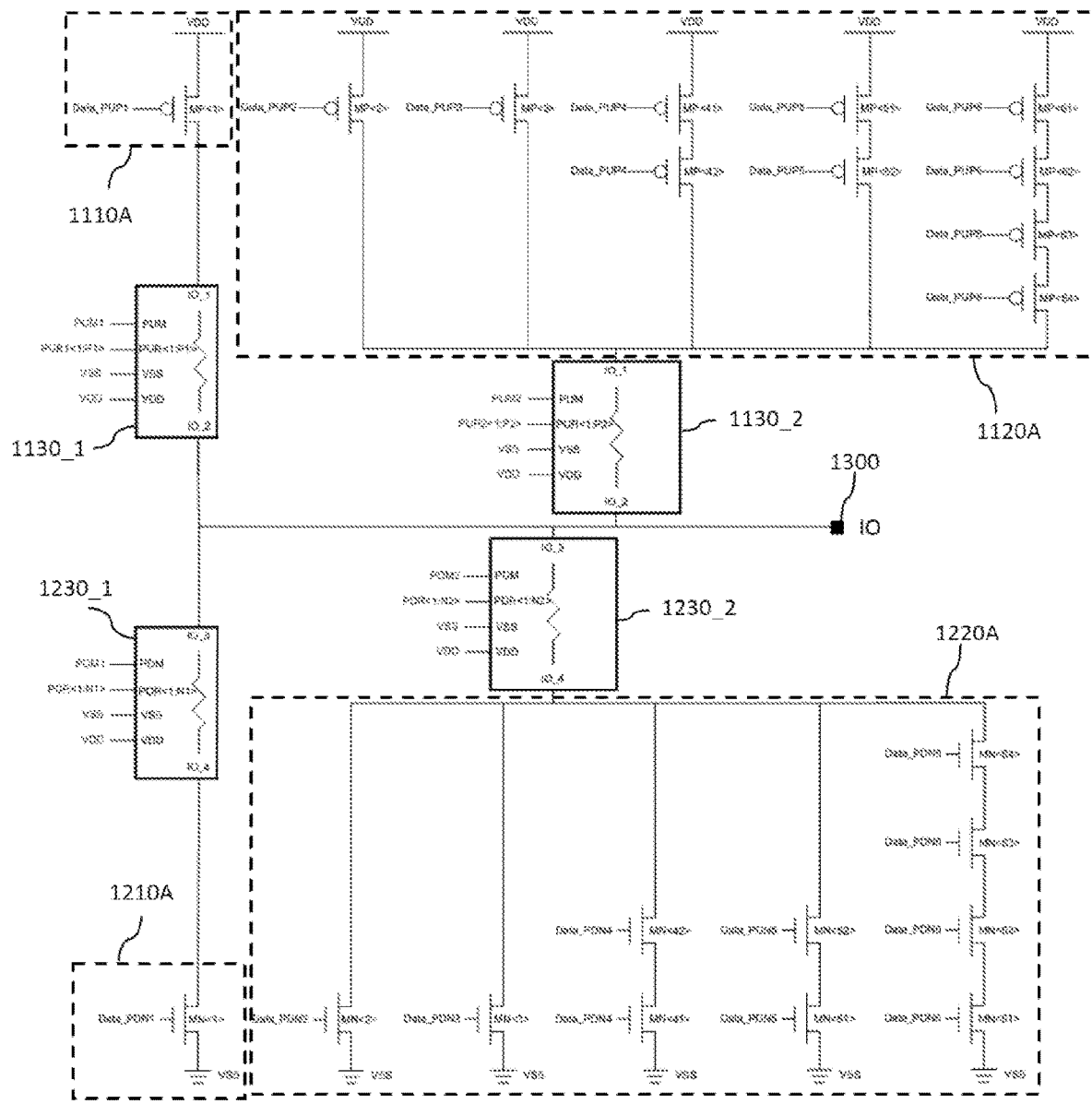
FIG. 9 is a circuit diagram of the OCD driver with the resistance-adjustable means according to the present invention.

FIG. 7 is a circuit diagram of the pull-up driver with the resistance-adjustable means according to the present invention. FIG. 8 is a circuit diagram of the pull-down driver with the resistance-adjustable means according to the present invention. FIG. 9 is a circuit diagram of an OCD driver with the resistance-adjustable means according to the present invention.

Referring to FIGS. 9 and 7, the present invention provides an adjustable OCD driver 1000A comprising a pull-up driver 1100A and a pull-down driver 1200A, the pull-up driver 1100A is configured to provide a first pull-up circuit 1110A, the first pull-up circuit 1110A including a first PMOS, which is coupled to a first LCAPUR 1130_1 and a VDD. A second pull-up circuit 1120A including a plurality of the PMOSs, and one end of each of the PMOSs is connected to a corresponding VDD, and the plurality of the PMOSs of the second pull-up circuit 1120A is eventually connected to a second LCAPUR 1130_2. The second pull-up circuit 1120A connected to the second LCAPUR 1130_2 is paralleled with the first pull-up circuit 1110A connected to the first LCAPUR 1130_1, and the first LCAPUR 1130_1 and the second LCAPUR 1130_2 are connected to the IO pad 1300, wherein the second pull-up circuit 1120A could comprise one of one or more second PMOSs coupled in series, or a plurality of second PMOSs coupled in series which are paralleled with each other as illustrated in FIG. 7, or the second pull-up circuit 1120A could be any combination of PMOSs, hence the second pull-up circuit 1120A is configured to be used to adjust the resistance of the pull-up driver 1100A with the first pull-up circuit 1110A, the first LCAPUR 1130_1, and the second LCAPUR 1130_2 in this present invention.

Next, referring to FIGS. 9 and 8. The pull-down driver 1200A is configured to provide a first pull-down circuit 1210A, the first pull-down circuit 1210A includes a first NMOS, which is coupled to a first LCAPDR 1230_1 and a VSS. A second pull-down circuit 1220A including a plurality of the NMOSs, and one end of each of the NMOSs is connected to the corresponding VSS. The plurality of the NMOSs of the second pull-down circuit 1220A are eventually connected to a second LCAPDR 1230_2. The second pull-down circuit 1220A connected to the second LCAPDR 1230_2 is paralleled with the first pull-down circuit 1210A connected to the first LCAPDR 1230_1, wherein the second pull-down circuit 1220A could comprise one of one or more second NMOSs coupled in series, or a plurality of second NMOSs coupled in series which are paralleled with each other as illustrated in FIG. 8, or the second pull-down circuit 1220A could be any combination of PMOSs, hence the second pull-down circuit 1220A is configured to be used to adjust the resistance of the pull-down driver 1200A with the first pull-down circuit 1210A, the first LCAPDR 1230_1, and the second LCAPDR 1230_2 in this present invention.

Figure 10:
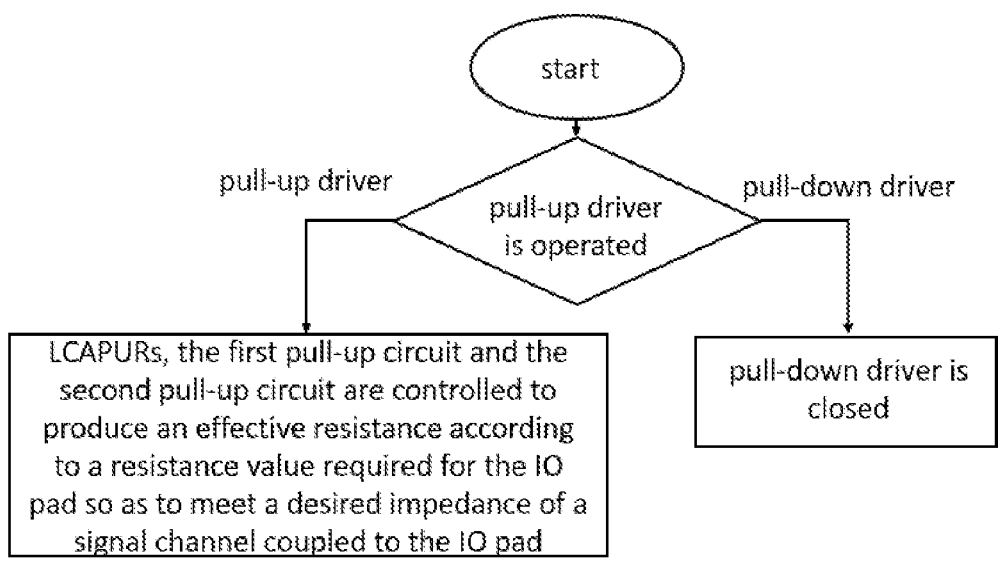
FIG. 10 is a flowchart illustrating an example of the OCD driver when the pull-up driver is operated.
Figure 11:
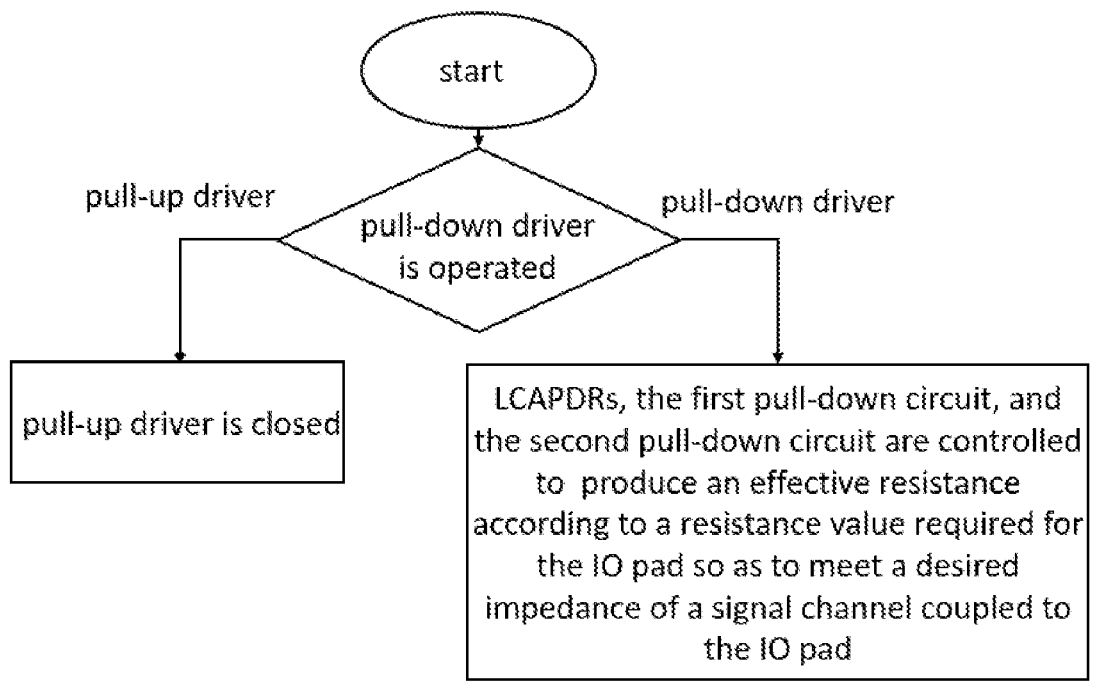
FIG. 11 is a flowchart illustrating an example of the OCD driver when the pull-down driver is operated.
Figure 12:
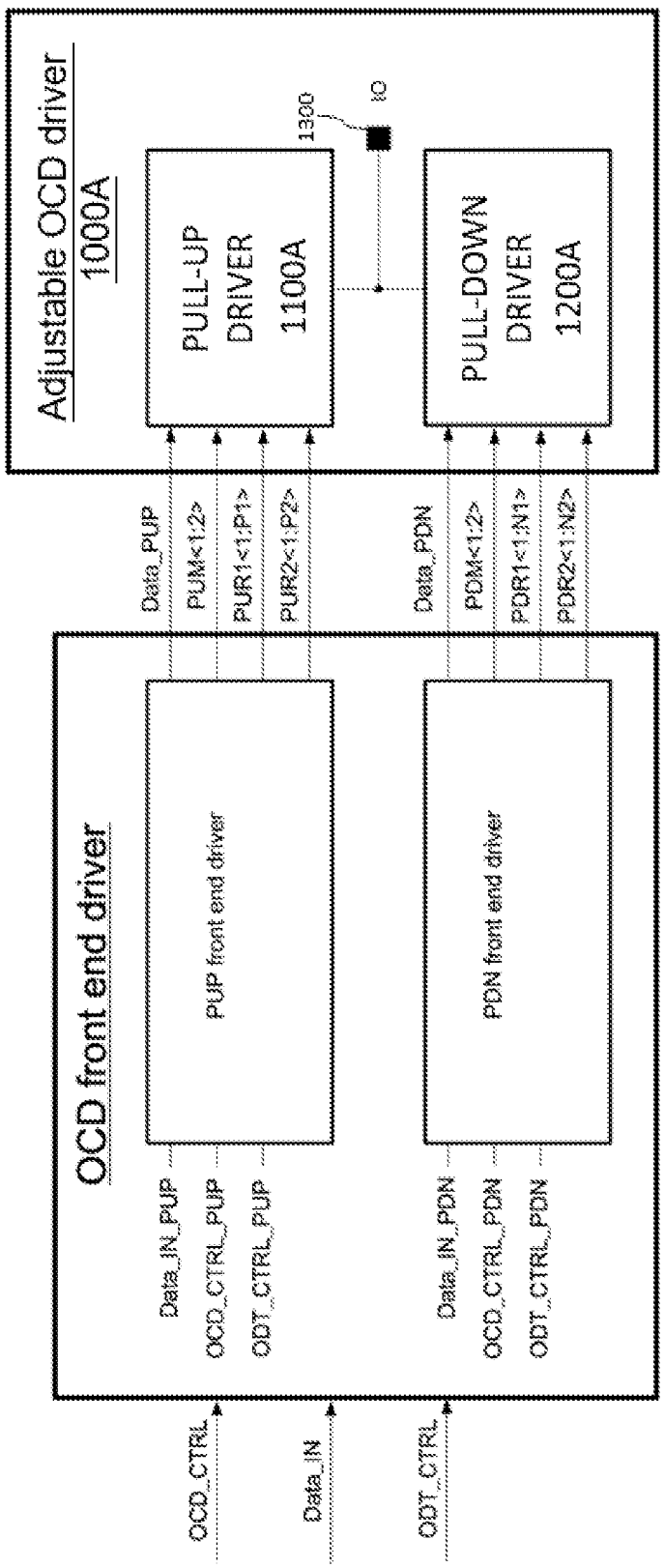
FIG. 12 is a block diagram of the adjustable OCD driver with a OCD front end driver according to the present invention.

FIG. 10 is a flowchart illustrating an example of the OCD driver 1000A when the pull-up driver 1100A is operated. FIG. 11 is a flowchart illustrating an example of the OCD driver when the pull-down driver 1200A is operated. FIG. 12 is a block diagram of the adjustable OCD driver with a OCD front end driver according to the present invention.

Referring to FIG. 12, the pull-up driver 1100A is operated and controlled by a pull-up control code (Data_PUP, such as Data_PUP=Data_PUP1–Data_PUP6) from the PUP front end driver of the OCD front end driver. Meanwhile, referring to FIGS. 9 and 10, the first pull-up circuit 1110A, the second pull-up circuit 1120A, the first LCAPUR 1130_1 and the second LCAPUR 1130_2 are controlled to produce an effective resistance according to a resistance value required for the IO pad 1300 so as to meet a desired impedance of a signal channel coupled to the IO pad 1300, wherein the first LCAPUR 1130_1 and the second LCAPUR 1130_2 are controlled by a code PUM<1:2>, PUR<1:P1>, and PUR<1:

P2> from the PUP front end driver (for example, in FIG. 9, the triode-mode PMOS of the first LCAPUR 1130_1 is controlled by the code PUM1, and the adjustable resistor circuit of the first LCAPUR 1130_1 is controlled by the code PUR<1:P1>) so as to provide a function of fine adjustment which can reduce impedance mismatch among signal channels. At the same time, the pull-down driver 1200A is turned off. As a result, for the IO pad 1300, the capacitance effect of the first pull-down circuit 1210A and the second pull-down circuit 1220A can be ignored, and the IO pad 1300 has only the capacitance effect of the first LCAPDR 1230_1 and the second LCAPDR 1230_2. Thus, the overall of the capacitance effect can be effectively reduced for the IO pad 1300 compared to the conventional OCD driver configuration shown in FIG. 2.

Similarly, referring to FIG. 12, the pull-down driver 1200A is operated and controlled by a pull-down control code (Data_PDN, such as Data_PDN=Data_PDN1–Data_PDN6) from the PDN front end driver of the OCD front end driver. Meanwhile, referring to FIGS. 9 and 11, the first pull-down circuit 1210A, the second pull-down circuit 1220A, the first LCAPDR 1230_1 and the second LCAPDR 1230_2 are controlled to produce an effective resistance according to a resistance value required for the IO pad 1300 so as to meet a desired impedance of a signal channel coupled to the IO pad 1300, wherein the first LCAPDR 1230_1 and the second LCAPDR 1230_2 are controlled by a code PDM<1:2>, PDR<1:N1>, and PDR<1:N2> from the PDN front end driver (for example, in FIG. 9, the triode-mode NMOS of the first LCAPDR 1230_1 is controlled by the code PDM1, and the adjustable resistor circuit of the first LCAPDR 1230_1 is controlled by the code PDR<1:N1>) so as to provide a function of fine adjustment for reducing impedance mismatch among signal channels. At the same time, the pull-up driver 1100A is turned off. As a result, for the IO pad 1300, the capacitance effect of the first pull-up circuit 1110A and the second pull-up circuit 1120A can be ignored, and the IO pad 1300 has only the capacitance effect of the first LCAPUR 1130_1 and the second LCAPUR 1230_1. Thus, the overall of the capacitance effect can be effectively reduced for the IO pad 1300.

The above-mentioned embodiments of the present invention are exemplary and not intended to limit the scope of the present invention. Various variation or modifications made without departing from the spirit of the present invention and achieving equivalent effects shall fall within the scope of claims of the present invention.

What is claimed is:

1. A resistance-adjustable means using at a pull-up driver of an OCD circuit, comprising:
   a triode-mode PMOS coupled to a circuit of the pull-up driver; and
   at least one of one or more adjustable resistors and/or a fixed resistor, which are connected in series and coupled to the triode-mode PMOS;
   wherein the at least one of the adjustable resistors or the fixed resistor is coupled to an IO (input/output) pad,
   wherein the triode-mode PMOS is controllably operated in a triode-mode when the pull-up driver is operating, and
   wherein the triode-mode PMOS is controllably operated in a cut off-mode when a pull-down driver of the OCD circuit is operating.

2. The resistance-adjustable means using at a pull-up driver of an OCD circuit of claim 1, wherein the fixed resistor is coupled to the IO pad when the resistance-adjustable means comprises both of the adjustable resistors and the fixed resistor.

3. The resistance-adjustable means using at a pull-up driver of an OCD circuit of claim 1, wherein the one or more adjustable resistors are controlled to produce an effective resistance according to a resistance value required for the IO pad so as to meet a desired impedance of a signal channel coupled to the IO pad.

4. The resistance-adjustable means using at a pull-up driver of an OCD circuit of claim 1, wherein each of the adjustable resistors includes a switch for controlling whether the adjustable resistor is short circuit or not.

5. The resistance-adjustable means using at a pull-up driver of an OCD circuit of claim 4, wherein the switch comprises a PMOS and/or a multiplexer.

6. The resistance-adjustable means using at a pull-up driver of an OCD circuit of claim 1, wherein the circuit of the pull-up driver comprises one of one or more PMOSs coupled in series, or a plurality of PMOSs coupled in series which are paralleled with each other.

7. A resistance-adjustable means using at a pull-down driver of an OCD circuit, comprising:
   a triode-mode NMOS coupled to a circuit of the pull-down driver;
   at least one of one or more adjustable resistors and/or a fixed resistor, which are connected in series and coupled to the triode-mode NMOS;
   wherein the at least one of the adjustable resistors or the fixed resistor is coupled to an IO (input/output) pad,
   wherein the triode-mode NMOS is controllably operated in a triode-mode when the pull-down driver is operating, and
   wherein the triode-mode NMOS is controllably operated in a cut off-mode when a pull-up driver of the OCD circuit is operating.

8. The resistance-adjustable means using at a pull-down driver of an OCD circuit of claim 7, wherein the fixed resistor is coupled to the IO pad when the resistance-adjustable means comprises both of the adjustable resistors and the fixed resistor.

9. The resistance-adjustable means using at a pull-down driver of an OCD circuit of claim 7, wherein the one or more adjustable resistors are controlled to produce an effective resistance according to a resistance value required for the IO pad so as to meet a desired impedance of a signal channel coupled to the IO pad.

10. The resistance-adjustable means using at a pull-down driver of an OCD circuit of claim 7, wherein each of the adjustable resistors includes a switch for controlling whether the adjustable resistor is short circuit or not.

11. The resistance-adjustable means using at a pull-down driver of an OCD circuit of claim 10, wherein the switch comprises a NMOS and/or a multiplexer.

12. The resistance-adjustable means using at a pull-down driver of an OCD circuit of claim 7, wherein the circuit of the pull-down driver comprises one of one or more NMOSs coupled in series, or a plurality of NMOSs coupled in series which are paralleled with each other.

13. An adjustable OCD driver, comprising:
   a pull-up driver controlled by a pull-up control code configured to provide a first pull-up circuit including a first PMOS coupled to a first resistance-adjustable means, and a second pull-up circuit is paralleled with the first pull-up circuit, wherein the second pull-up circuit is coupled to a second resistance-adjustable means;

a pull-down driver controlled by a pull-down control codes configured to provide a first pull-down circuit including a first NMOS coupled to a third resistance-adjustable means, and a second pull-down circuit is paralleled with the first pull-down circuit, wherein the second pull-down circuit is coupled to a fourth resistance-adjustable means;

wherein the first resistance-adjustable means is configured to provide a first triode-mode PMOS coupled between the first PMOS and at least one of one or more first adjustable resistors and/or a first fixed resistor, wherein the at least one of the first adjustable resistors or the first fixed resistor is coupled to an IO (input/output) pad; wherein the third resistance-adjustable means is configured to provide a first triode-mode NMOS coupled between the first NMOS and at least one of one or more second adjustable resistors and/or a second fixed resistor, wherein the at least one of the second adjustable resistors or the second fixed resistor is coupled to the IO pad; wherein both the second resistance-adjustable means and the fourth resistance-adjustable means are coupled to the IO pad, wherein the triode-mode PMOS is controllably operated in a cut off-mode when the pull-down driver is operating, and wherein the triode-mode NMOS is controllably operated in a cut off-mode when the pull-up driver is operating.

14. The adjustable OCD driver of claim 13, wherein the second resistance-adjustable means is configured to provide a second triode-mode PMOS coupled between the second pull-up circuit and at least one of one or more third adjustable resistors and/or a third fixed resistor.

15. The adjustable OCD driver of claim 13, wherein the fourth resistance-adjustable means is configured to provide a second triode-mode NMOS coupled between the second pull-down circuit and at least one of one or more fourth adjustable resistors and/or a fourth fixed resistor.

16. The adjustable OCD driver of claim 13, wherein the second pull-up circuit comprises one of one or more second PMOSs coupled in series, or a plurality of second PMOSs coupled in series which are paralleled with each other.

17. The adjustable OCD driver of claim 13, wherein the second pull-down circuit comprises one of one or more second NMOSs coupled in series, or a plurality of second NMOSs coupled in series which are paralleled with each other.

* * * * *